US007285308B2

(12) United States Patent
Hendrix et al.

(10) Patent No.: US 7,285,308 B2
(45) Date of Patent: Oct. 23, 2007

(54) CHEMICAL VAPOR DEPOSITION OF HIGH CONDUCTIVITY, ADHERENT THIN FILMS OF RUTHENIUM

(75) Inventors: Bryan C. Hendrix, Danbury, CT (US); James J. Welch, New Fairfield, CT (US); Steven M. Bilodeau, Oxford, CT (US); Jeffrey F. Roeder, Brookfield, CT (US); Chongying Xu, New Milford, CT (US); Thomas H. Baum, New Fairfield, CT (US)

(73) Assignee: Advanced Technology Materials, Inc., Danbury, CT (US)

( * ) Notice: Subject to any disclaimer, the term of this patent is extended or adjusted under 35 U.S.C. 154(b) by 359 days.

(21) Appl. No.: 10/803,750

(22) Filed: Mar. 18, 2004

(65) Prior Publication Data

US 2005/0186341 A1 Aug. 25, 2005

Related U.S. Application Data

(60) Provisional application No. 60/546,801, filed on Feb. 23, 2004.

(51) Int. Cl.
*C23C 16/00* (2006.01)

(52) U.S. Cl. .............. 427/248.1; 427/250; 427/255.28; 427/255.31

(58) Field of Classification Search ................ 427/250, 427/255.28, 255.31
See application file for complete search history.

(56) References Cited

U.S. PATENT DOCUMENTS

| 6,440,495 | B1 * | 8/2002 | Wade et al. ................ 427/250 |
| 6,479,100 | B2 * | 11/2002 | Jin et al. ............... 427/255.31 |
| 6,680,251 | B2 | 1/2004 | Won et al. |
| 6,743,739 | B2 * | 6/2004 | Shimamoto et al. ........ 438/780 |
| 6,849,122 | B1 | 2/2005 | Fair |
| 2003/0165615 | A1 * | 9/2003 | Aaltonen et al. ............. 427/79 |

FOREIGN PATENT DOCUMENTS

WO    WO - 00/15885 A1    3/2000

OTHER PUBLICATIONS

Papadatos, Filippos, et al., Characterization of Ruthenium and Ruthenium Oxide Thin Films deposited by Chemical Vapor Deposition for CMOS Gate . . . , Mat. Res. Soc. Symp. Proc., 2003, pp. N3.3.1-N3.3.6, vol. 745.

* cited by examiner

*Primary Examiner*—Timothy Meeks
*Assistant Examiner*—Kelly M. Stouffer
(74) *Attorney, Agent, or Firm*—Steven J. Hultquist; Intellectual Property/Technology Law; Maggie Chappuis

(57) ABSTRACT

A multi-step method for depositing ruthenium thin films having high conductivity and superior adherence to the substrate is described. The method includes the deposition of a ruthenium nucleation layer followed by the deposition of a highly conductive ruthenium upper layer. Both layers are deposited using chemical vapor deposition (CVD) employing low deposition rates.

79 Claims, 4 Drawing Sheets

CHEMICAL VAPOR DEPOSITION OF HIGH CONDUCTIVITY, ADHERENT THIN FILMS OF RUTHENIUM

CROSS REFERENCE TO RELATED APPLICATIONS

This application claims priority to U.S. Provisional Patent Application No. 60/546,801 for "Chemical Vapor Deposition of High Conductivity, Adherent Thin Films of Ruthenium" filed on Feb. 23, 2004 in the name of Bryan C. Hendrix et al.

FIELD OF THE INVENTION

The present invention relates to the chemical vapor deposition of ruthenium thin films. More specifically, the present invention relates to a multi-step process for the chemical vapor deposition of ruthenium thin films, including the deposition of a ruthenium nucleation layer that provides superior adhesion to, and continuous coverage of, the substrate followed by the deposition of a highly conductive ruthenium upper layer that is adherent to the nucleation layer.

DESCRIPTION OF THE RELATED ART

The noble metal ruthenium (Ru) is being widely investigated for use in conductive layers of integrated circuits (IC). In particular, layers comprising ruthenium are being investigated for use as the lower (bottom) electrode of IC capacitors that may be used, for example, in Dynamic Random Access Memories (DRAM). In addition, ruthenium thin films are used as the high work function gate electrode material for dual metal gates and as a direct-platable barrier material for Cu-low k dual damascene interconnects.

The major challenges in depositing ruthenium films include obtaining a ruthenium thin film that is highly conductive, i.e., having low resistance, while displaying good adhesion to the substrate, e.g., dielectric, surface and high conformality. In particular, the deposition of very thin ruthenium films (<10 nm) that are smooth and continuous has been challenging.

Traditionally, sputtering methods have been used to deposit ruthenium films, yielding layers having good surface morphology and low resistance. However, sputtering is limited by poor step coverage when the critical dimensions (CD) are small and the aspect ratios are high, which may be disadvantageous when forming three-dimensional high capacitance electrode structures such as cylinder-type or fin-shaped capacitor electrodes or when producing direct-platable barriers on high aspect ratio structures, e.g., copper interconnects. Additionally, although sputtered ruthenium has been shown to possess the necessary work function for p-MOS transistors, the potential for ion damage to the transistor channel precludes the consideration of sputtering for mass production.

Chemical vapor deposition (CVD) is also used to form ruthenium layers. In CVD, ruthenium is deposited on an IC substrate, e.g., a dielectric layer, using a gasified ruthenium source and a co-reactant gas. CVD of thin ruthenium films achieves good step coverage and wafer-to-wafer repeatability on complicated topography. Unfortunately, a ruthenium layer formed by CVD may have poor surface morphology or high impurity content and as such, a high electrical resistivity. If the ruthenium layer is the bottom electrode of a MIM capacitor, poor surface morphology can result in high leakage current in the capacitor.

To increase the adherence of a ruthenium film to the substrate surface, sticking layers and seed layers have been proposed. For example, when fabricating MIM capacitor stacks, a titanium nitride (TiN) sticking layer may be deposited onto a substrate followed by deposition of the ruthenium electrode on the sticking layer. However, the sticking layer produced is often too thick for increasingly fine feature sizes, and as such has limited applicability, or alternatively the sticking layer modifies the effective work function of the metal.

U.S. Pat. No. 6,479,100 to Jin et al. discloses a method of depositing a ruthenium seed layer on a substrate using CVD. According to Jin et al., the deposited ruthenium seed layers should contain oxygen to improve adherence to the substrate, but the characteristics of the subsequently deposited thin ruthenium film onto the seed layer were enhanced when the oxygen content of the seed layer is relatively low. Towards that end, Jin et al. disclosed that the deposited ruthenium oxide seed layer must be annealed prior to deposition of the pure ruthenium thin metal film thereon. However, the reported resistivity of the deposited thin films was 50 to 55 $\mu\Omega$-cm for 130 to 140 Å films, which is a factor of seven worse than the resistivity for bulk ruthenium (7.4 $\mu\Omega$-cm) and is worse than the resistivity for bulk $RuO_2$ (44 $\mu\Omega$-cm).

Other prior art methods teach the two-step deposition of ruthenium thin films, wherein the rate of deposition is high to ensure complete coverage of the substrate surface. However, it is well known in the chemical arts that rapidly grown crystals and crystal layers tend to incorporate impurities and other point defects leading to inferior electrical properties relative to those grown slowly.

It would therefore be a significant advance in the art to provide a chemical vapor deposition method for depositing ruthenium thin films wherein the deposited ruthenium films are thin, highly conformal, highly conductive, and highly adhesive to all underlying materials, while minimizing the cost of ownership of the process.

SUMMARY OF THE INVENTION

The present invention relates to the chemical vapor deposition of ruthenium thin films. More specifically, the present invention relates to a multi-step process for the chemical vapor deposition of ruthenium thin films, including the deposition of a ruthenium nucleation layer that provides superior adhesion to, and continuous coverage of, the substrate followed by the deposition of a highly conductive ruthenium upper layer that is adherent to the nucleation layer.

In one aspect, the invention relates to a method for depositing a ruthenium thin film onto a substrate, said method comprising:

(a) depositing a nucleation layer comprising ruthenium onto the substrate by chemical vapor deposition, wherein the nucleation layer is deposited using a nucleation layer gas mixture under nucleation layer CVD conditions; and (b) depositing an upper layer comprising ruthenium onto the nucleation layer by chemical vapor deposition, wherein the upper layer is deposited using an upper layer gas mixture under upper layer CVD conditions.

In another aspect, the invention relates to a method for depositing a ruthenium thin film onto a substrate, said method comprising:

(a) depositing a nucleation layer comprising ruthenium onto the substrate by chemical vapor deposition, wherein the nucleation layer is deposited using a nucleation layer gas mixture in an oxidizing environment under nucleation layer CVD conditions; and (b) deoxygenating the nucleation layer comprising ruthenium in a reducing environment, wherein (a) and (b) are repeated sequentially and continuously until the ruthenium thin film of desired thickness is deposited onto the substrate.

Other aspects, features and embodiments of the invention will be more fully apparent from the ensuing disclosure and appended claims.

DETAILED DESCRIPTION OF THE INVENTION, AND PREFERRED EMBODIMENTS THEREOF

Figure 1:
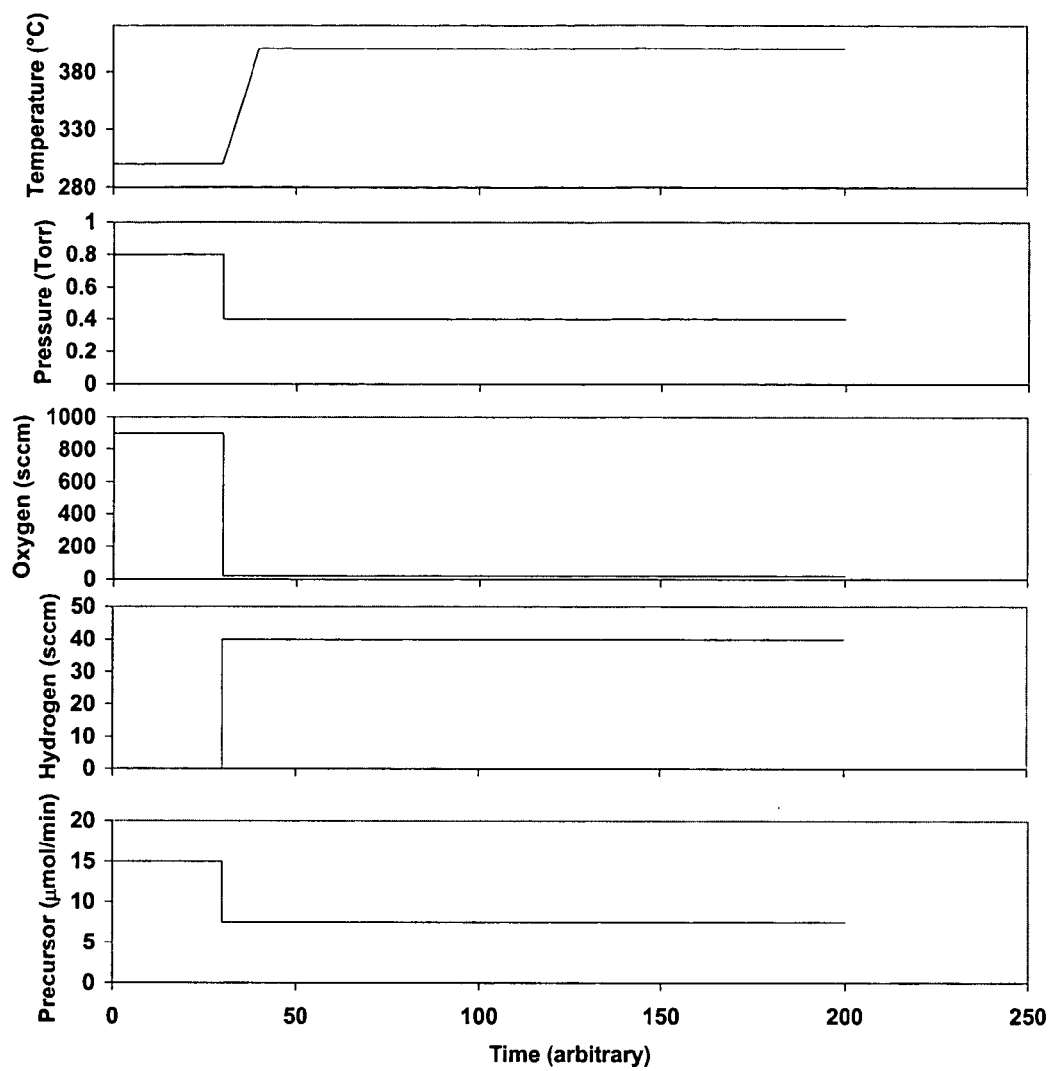
FIG. 1 is a schematic of the process conditions as a function of time (arbitrary units) associated with deposition process 7.

The present invention relates to multi-step methods for depositing ruthenium thin films having high conductivity and superior adherence to the substrate. The method includes the deposition of a ruthenium nucleation layer under conditions that provide superior adhesion to, and continuous coverage of, the substrate surface followed by the deposition of a highly conductive ruthenium upper layer that is adherent to the nucleation layer. Both layers are deposited using chemical vapor deposition (CVD).

As defined herein, "peel-resistant layer films" are films deposited on substrates according to the methods taught herein that are non-delaminated by application of tape and peel removal thereof.

In general, when a ruthenium film is formed by CVD, the surface morphology of the deposited film may vary depending on the process conditions, including substrate temperature, chamber pressure, precursor flow rate and reactive gas flow rates. Importantly, the morphology of the deposited film influences the electrical characteristics, e.g., the sheet resistance of the film.

It is well known in the art that smooth, continuous films are preferred as barrier layers or electrical contacts. When the deposition rate on the substrate surface is less than the deposition rate on nuclei present on the substrate surface, i.e., the rate of growth is greater in a direction perpendicular to the film, poor coverage of the substrate may be observed even though the film may be quite thick. Under these growth conditions, what is observed are various grains, or islands, on the substrate surface, that may or may not be interconnected. In this case, the sheet resistance of the film is controlled by the trickle of current through the various contacts between grains rather than the resistivity of the grains themselves. As such, it is preferable that as a film grows on a substrate, the grains grow laterally, covering the entire substrate surface at a rate as great, or greater than, the perpendicular growth of the film at nuclei. This ensures that the grains are substantially physically, and thus electrically, interconnected so that the sheet resistance is dictated by the resistivity of the grains themselves.

When a ruthenium film is used as an electrode in a three-dimensional capacitor electrode in a semiconductor device having a high integration density, a rough film morphology affects the leakage and voltage breakdown properties of the capacitor. It is generally desirable to deposit a uniform thin film having a thickness of less than 1000 Å, with good step coverage and excellent electrical characteristics. In view of the foregoing discussion, it may be difficult to use a ruthenium film consisting essentially of poorly contacting grains as a capacitor electrode.

In addition to film morphology considerations, ruthenium films formed by CVD typically include small amounts of carbon (from the ruthenium source) and oxygen (from the co-reactant gas) as impurities. Impurities may deteriorate the electrical characteristics of the deposited ruthenium film by increasing the resistance of the ruthenium film. Therefore, it is preferable that the amount of impurities contained in the deposited ruthenium film is kept low.

It is well-known in the art that full coverage of the substrate is enhanced by high oxygen levels in the process gas, surface reaction rate-limited depositions and low temperatures (which enhances the nucleation rate). However, regardless of the coverage enhancer chosen, high residual impurity films are deposited. For example, when depositing ruthenium in the presence of high oxygen levels, oxygen-rich ruthenium metal films, including $RuO_2$, are deposited.

It is also well known in the art that a surface reaction rate-limited deposition is required for a process to conformally coat high aspect structures. As defined herein, "surface reaction rate-limited depositions" result when, for a particular temperature and co-reactant gas, the precursor gas is transported to the surface faster than it can react on the surface. As such, the rate of film deposition is controlled by the reaction kinetics of the surface and is independent of mass transport of the precursor to the surface. Surface reaction rate-limited deposition is distinguished from mass transport rate-limited deposition in that, for the same temperature and co-reactant gas, the precursor reacts as fast as it transported to the surface in a mass transport limited deposition. Under surface reaction rate-limited deposition conditions, the surface is saturated with unreacted precursor molecules so that the deposition rate is uniform on all surfaces. At a particular temperature, the mass transport rate of the precursor molecule can be increased to achieve surface reaction rate-limited deposition. Alternatively, at a particular mass transport rate to a surface, the temperature can be decreased to achieve a surface reaction rate-limited deposition. As stated hereinabove, this deposition regime is subject to the incorporation of deleterious impurities in the ruthenium film.

It has been surprisingly discovered that by controlling the deposition rates at various points in the process, the ruthenium thin films deposited by CVD according to the method herein have superior characteristics, including full coverage, high conformality, superior adherence and high conductivity.

When forming a ruthenium film by CVD, a substrate is typically loaded into the CVD chamber and a ruthenium precursor gas and a co-reactant gas are supplied to the chamber. A solid precursor may be sublimed to generate the precursor gas. Alternatively, a high efficiency solid source ampoule, such as the vaporizer delivery system described in U.S. patent application Ser. No. 10/201,518 in the name of John Gregg et al., incorporated herein by reference, can be used to provide higher precursor flows at lower temperatures (for longer precursor lifetime). A liquid precursor may be directly vaporized to generate the precursor gas. Alternatively, the solid or liquid precursor may be dissolved in a solvent including, but not limited to, alkanes, alkanols and tetrahydrofuran (THF). Alkanols contemplated include ROH, where R can be straight-chained or branched $C_1$-$C_5$ alkyl groups (e.g., Me, Et, i-Pr, n-Pr, t-Bu, n-Bu, n-Am, i-Am, t-Am, etc.). Especially useful are solvents that can also act as reducing agents in the MOCVD process. In practice, the solution containing the precursor may be vaporized to generate the precursor gas.

The delivery of the precursor to the CVD chamber can be by solid delivery or liquid delivery. As defined herein, "solid delivery approach" includes the heating of the solid precursor source to vaporize the solid precursor. As the vaporized precursor is released from the solid source, a quantity of the precursor vapor is mixed with the carrier gas for transport to the CVD chamber. In a preferred embodiment, a solvent may be vaporized simultaneously for mixture with the carrier gas. The carrier gas mixture comprising the vaporized precursor and the vaporized solvent is subsequently transported to the CVD chamber. Solvents contemplated include, but are not limited to, alkanes, alkanols and tetrahydrofuran (THF). Alkanols contemplated include ROH, where R can be straight-chained or branched $C_1$-$C_5$ alkyl groups (e.g., Me, Et, i-Pr, n-Pr, t-Bu, n-Bu, n-Am, i-Am, t-Am, etc.). As defined herein, "liquid delivery approach" includes the transport of a precursor liquid (either a molten precursor or a precursor solution) to a vaporization zone for vaporization of the precursor therein. Thereafter, the vaporized precursor is transported to the CVD chamber.

Examples of suitable ruthenium sources include ruthenocenes having the formula (Cp')Ru(Cp"), where Cp' and Cp" can be the same or different and have the general formula:

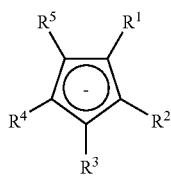

where $R^1$-$R^5$ can be independently selected from the group consisting of H, F, and straight-chained or branched $C_1$-$C_5$ alkyl groups (e.g., Me, Et, i-Pr, n-Pr, t-Bu, n-Bu, sec-Bu, n-amyl, i-amyl, t-amyl, etc.). Examples of ruthenocenes contemplated herein include, but are not limited to, Ru(EtCp)$_2$ and Ru(Cp)$_2$.

Alternatively, the ruthenium source may comprise a ruthenium β-diketonate having the formula Ru(β-diketonate)$_3$, where β-diketonate is described by the general formula:

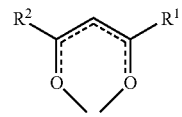

where $R^1$ and $R^2$ can be independently selected from the group consisting of H, F, straight-chained or branched $C_1$-$C_5$ alkyl groups (e.g., Me, Et, i-Pr, n-Pr, t-Bu, n-Bu, sec-Bu, n-amyl, t-amyl, etc.), and fluorine-substituted straight-chained or branched $C_1$-$C_5$ alkyl groups (e.g., Me, Et, i-Pr, n-Pr, t-Bu, n-Bu, sec-Bu, n-amyl, i-amyl, t-amyl, etc.). Specific examples of β-diketonates include, but are not limited to:
  acac=2,4-pentanedionate
  tfac=1,1,1-trifluoro-2,4-pentanedionate;
  thd=2,2,6,6-tetramethyl-3,5-heptanedionate;
  hfac=1,1,1,5,5,5-hexafluoro-2,4-pentanedionate;
  tod=2,2,7-tetramethyl-3,5-octanedionato;
  fod=6,6,7,7,8,8,8-heptafluoro-2,2-dimethyl-3,5-octanedionato; and
  od=2,4-octanedionato.

Preferably, $R^1$ and $R^2$ are independently selected from the group consisting of $C_1$-$C_5$ fluoroalkyl groups when non-selectively depositing a seed layer on a substrate having both dielectric and metallic regions.

As a further alternative, the ruthenium source gas may comprise a ruthenium β-diketonate neutral Lewis base adduct, having the formula Ru(β-diketonate)$_x$L$_{3-x}$, where x can be 1 or 2, β-diketonate is defined above, and L can be alkenes, alkynes, cycloalkenes or cycloalkynes, for example, cyclooctadiene (COD), 1,5-dimethyl-1,5-cyclooctadiene (DMCOD) and 2-butyne.

In another alternative, the ruthenium source gas may comprise ruthenium carbonyls, such as Ru(CO)$_5$, Ru$_3$(CO)$_{12}$, and Ru$_2$(CO)$_9$, ruthenium oxides, such as RuO$_4$, or ruthenium halides, such as RuCl$_3$. Preferably, RuCl$_3$ or ruthenium carbonyls are used for non-selectively depositing a seed layer on a substrate having both dielectric and metallic regions.

Examples of co-reactant gases include oxygen, hydrogen, steam, nitrous oxide, ozone, carbon monoxide and carbon dioxide. In addition, solvents for the precursor, including alkanols and tetrahydrofuran (THF), may act as liquid co-reactants. Alkanols contemplated include ROH, where R can be straight-chained or branched $C_1$-$C_4$ alkyl groups (e.g., Me, Et, i-Pr, n-Pr, t-Bu, i-Bu, n-Bu, t-Am, i-Am, n-Am, etc.). During deposition, an inert gas such as argon or nitrogen may be used as a carrier gas for smoothly supplying the ruthenium source gas or reactant gas and as a purge gas for purging the deposition chamber.

Examples of substrates include silicon, silicon dioxide, silicon nitride, low k materials, Co(WP) capping layers, copper, hafnium silicate, hafnium oxide, hafnium silicate nitride (Hf—Si—O—N), hafnium oxide nitride (Hf—O—N), titanium nitride, titanium aluminum nitride (TiAlN), tantalum nitride, tantalum pentoxide (Ta$_2$O$_5$), barium strontium titanate (BST) or lead zirconate titanate (PZT).

In conventional CVD methods, a ruthenium film is typically deposited under constant process conditions, including temperature, pressure, oxygen content and ruthenium precursor content. In accordance with the embodiments of the present invention, however, ruthenium films are formed by changing the process conditions during the CVD procedure.

In one aspect, the present invention relates to a multi-step method for depositing ruthenium thin films having high conductivity and superior adherence to the substrate. The method includes the deposition of a ruthenium nucleation layer followed by the deposition of a highly conductive ruthenium upper layer. Together, the ruthenium nucleation layer and the ruthenium upper layer make up the "ruthenium thin film" of the present invention.

The first deposition step of the CVD method is carried out under oxidizing conditions at temperatures ranging from about 250° C. to about 340° C. If the temperature is less than about 250° C., the deposition rate is too slow for full coverage of the substrate. In contrast, if the temperature is greater than about 340° C., the nuclei formed on the substrate grow separately and do not coalesce until the films are quite thick, e.g., greater than 500 Å. By maintaining the CVD temperatures between about 250° C. and 340° C., a continuous film of less than 50 Å, and more preferably less than 35 Å can be deposited. In a particularly preferred embodiment, the nucleation layer deposited during the first step has a thickness of about 5 Å to about 10 Å.

The pressure of the CVD chamber during the first deposition step is from about 5 Torr to about 0.1 Torr, preferably from about 2 Torr to about 0.2 Torr. In a particularly preferred embodiment, the pressure of the CVD chamber during the first deposition step is from about 1 Torr to about 0.4 Torr.

In addition to temperature and pressure, the oxygen content during the first deposition step of the deposition process is important. When depositing the ruthenium nucleation layer, the precursor:co-reactant gas mixture should have an oxygen content greater than about 30 mole % oxygen, based on the total number of moles in the process gas mixture. More preferably, the oxygen content should be from about 80 mole % to about 95 mole %, based on the total number of moles in the process gas mixture.

The rate of introduction of the ruthenium precursor gas during the first deposition step of the CVD method should be from about 2 µmol/min to about 100 µmol/min, preferably about 15 µmol/min to about 30 µmol/min, said rate of introduction of ruthenium precursor being adjusted to maintain surface reaction rate-limited deposition. In a particularly preferred embodiment, the rate of introduction of the ruthenium precursor gas during the first deposition step is about 15 µmol/min when the wafer temperature is 280° C. In another particularly preferred embodiment, the rate of introduction of the ruthenium precursor gas during the first deposition step is about 30 µmol/min when the wafer temperature is 300° C.

The deposition rate of the ruthenium nucleation layer deposited during the first deposition step of the process should be from about 20 Å/min to about 1 Å/min, more preferably from about 10 Å/min to about 1 Å/min, most preferably about 5 Å/min to about 1 Å/min.

In a preferred embodiment, the ruthenium nucleation layer is deposited using a precursor chosen for its ability to substantially cover the substrate surface with the thinnest possible layer. "Substantially" covering is defined herein as covering at least 90% of the exposed substrate surface. For example, thin films deposited using ruthenium β-diketonates such as Ru(thd)$_3$ as the precursor provide more substantial coverage and lower resistivity than thin films deposited using a Ru(EtCp)$_2$ precursor. As described herein, the ruthenium nucleation layer will be continuous and adherent to the underlying substrate materials. It is further noted that the nucleation layer will have good electrical contact, i.e., low contact resistance, with metallic regions of the underlying substrate materials.

The second deposition step of the CVD method is carried out under conditions that produce films with a low percentage of impurities such as oxygen and/or carbon. Preferred films consist essentially of the deposited metal film having an impurity content of less than about 2 atomic %.

During the second deposition step, a ruthenium upper layer is chemically vapor deposited onto the ruthenium nucleation layer deposited during the first deposition step. Because the deposited ruthenium nucleation layer is continuous and has superior adherence to the underlying substrate and the ruthenium upper layer is continuous and has superior adherence to the underlying nucleation layer, the ruthenium thin film of the invention has superior adhesion to the underlying substrate.

To ensure the deposition of a continuous upper layer, the second deposition step process conditions should be more reducing than the first deposition step process conditions. This can be achieved by lowering the oxygen content of the process gas stream, lowering the absolute pressure of the process, or increasing the temperature of the substrate.

The second deposition step of the CVD method is carried out at temperatures equivalent to, or higher than, the temperatures of the first deposition step of the CVD method. Preferably, the temperature of the second deposition step is from about 250° C. to about 400° C., more preferably from about 300° C. to about 400° C., most preferably from about 350° C. to about 400° C. Notably, in applications where temperatures above 400° C. are compatible with the integration, temperatures above 400° C. may be advantageous.

The pressure of the CVD chamber during the second deposition step is carried out at pressures equivalent to, or less than, the pressures of the first step of the CVD method. Preferably, the pressure of the chamber during the second deposition step is from about 2 Torr to about 0.1 Torr, more preferably from about 1 Torr to about 0.2 Torr. In a particularly preferred embodiment, the pressure of the CVD chamber during the second deposition step is less than about 0.4 Torr.

With regards to process gases, the co-reactant gas used during the second deposition step is preferably an oxygen gas:hydrogen gas mixture having a molar percentage ratio between about 1:1 and about 1:3, preferably about 1:2. Preferably, the precursor:co-reactant gas mixture has an oxygen content less than about 50 mole % oxygen, based on the total number of moles in the process gas mixture. More preferably, the oxygen content is from about 20 mole % to about 1 mole %, based on the total number of moles in the process gas mixture.

The rate of introduction of the ruthenium precursor gas during the second deposition step of the CVD method should be less than that which keeps the process in the surface reaction rate-limited deposition regime. Preferably, the precursor flow rate of the second deposition step is chosen to produce the lowest resistivity films in the least amount of time within the constraints of the chosen integration scheme. It is preferred that the rate of introduction of ruthenium precursor during the second deposition step is the same as, or less than, the rate of introduction of ruthenium precursor during the first deposition step, most preferably between about 5 µmol/min and 20 µmol/min.

The deposition rate of the ruthenium upper layer deposited during the second deposition step of the process should be from about from about 15 Å/min to about 1 Å/min, more preferably from about 10 Å/min to about 1 Å/min, most preferably about 5 Å/min to about 1 Å/min.

In a particularly preferred embodiment, the final ruthenium thin film deposited during the multi-step CVD process is a continuous film having a high density and superior adherence to the underlying substrate. Unexpectedly, if the ruthenium thin film is deposited onto the substrate using lower deposition rates, as described herein, the ruthenium thin film will have a low resistivity relative to its thickness.

For example, using the CVD method taught herein, films have been deposited with a resistivity of less than 100 $\mu\Omega$-cm at a thickness of about 25 Å, a resistivity of 20 $\mu\Omega$-cm at a thickness of about 85 Å, and a resistivity of less than 10 $\mu\Omega$-cm at a thickness of about 350 Å.

A further embodiment of the CVD method includes an intermediate annealing step, wherein the ruthenium nucleation layer is annealed in a reducing atmosphere, e.g., hydrogen gas, prior to deposition of the ruthenium upper layer thereon. The ruthenium nucleation layer is annealed in a $H_2$, $H_2/N_2$ or $H_2/Ar$ environment at about 200° C. to about 400° C., most preferably the temperature of the second deposition step. Annealing the nucleation layer reduces both the oxygen and carbon content of the ruthenium nucleation layer, concomitantly improving its electrical conductivity, without decreasing its adhesion to a substrate surface. In addition, post-deposition anneals are contemplated for further improving conductivity of the ruthenium thin film deposited during the two-step CVD process.

In a further embodiment, the CVD method may be a pulsed process, wherein the first deposition step is carried out as described hereinabove, followed by a deoxygenating step, wherein the nucleation layer is processed in the absence of ruthenium precursor. Preferably, the deoxygenating step in this embodiment is carried out in the absence of precursor under process conditions that are more reducing than those of the first deposition step process, including lower pressure, lower oxygen content, higher temperature and higher reducing agent, e.g., hydrogen, content. This two step process may be successively and continuously repeated until the ruthenium thin film of desired thickness is deposited. In a particularly preferred embodiment, the temporal length of deposition of steps 3, 5, 7, etc., are approximately equal and less than the length of deposition of step 1. Notably, the rate of precursor mass transport is preferably maintained at a high enough level during the deposition steps, i.e., steps 1, 3, 5, etc., to maintain a surface reaction rate-limited deposition. This ensures that highly conformal films can be deposited with low impurity content and low resistivity on high aspect ratio substrates.

In a still further embodiment, the ruthenium precursor employed during the deposition of the nucleation layer is different than the ruthenium precursor employed during the deposition of the upper layer of the film. For example, ruthenium β-diketonates are preferred for the deposition of the nucleation layer because of their full coverage of the substrate, low resistivity, and good adhesion. During the deposition of the upper layer of the film, ruthenocenes are preferred because of their higher growth rate, low resistivity and superior adhesion to the underlying ruthenium nucleation layer. The particular precursors used for the deposition of each layer can be chosen by experimentation as is generally practiced in the art. Preferably, the deposition of the nucleation layer using a first ruthenium precursor occurs at a lower deposition rate than the deposition of the upper layer using a second ruthenium precursor.

The CVD process described herein may be modified for capping copper conductors in a damascene structure with a ruthenium thin film. For example, ruthenium films may be deposited from a ruthenium precursor gas, e.g., $Ru(EtCp)_2$, under inert or reducing atmospheres at high temperatures, e.g., 400° C. Under these process conditions, the percentage of oxide impurities in the deposited ruthenium thin film is negligible. In a preferred embodiment, hydrogen is used as a co-reactant gas, which enhances the surface selectivity of the deposition process so that ruthenium capping layers are deposited only on the exposed copper of the substrate.

The features and advantages of the invention are more fully shown by the illustrative examples discussed below.

EXAMPLE 1

Comparison of Nucleation Layers Deposited Using $Ru(EtCp)_2$ Precursor Relative to those Deposited Using $Ru(thd)_3$ Precursor An experiment was designed to compare $Ru(EtCp)_2$ to $Ru(thd)_3$ precursors over a wide range of process conditions to investigate the precursors relative utility when depositing very thin conductive films. The molar flow rate of the precursor was held constant at 15 µmol/min, the deposition time was held constant at 600 seconds and the total gas flow was held constant at 1000 sccm. Pressure, temperature, and reactive gas mixture were varied as shown in Table 1. The resulting film thicknesses (measured by XRF calibrated to RBS) and film resistivities (calculated using the physical thickness measured by spectroscopic ellipsometry) of the deposited films are also provided in Table 1. If film resistivity is not provided, it was too high to measure, indicating that the film was not continuous and/or contained substantial quantities of impurities. Of note, contrary to the teaching of Won et al. (see U.S. Pat. No. 6,680,251), which teaches seed layer deposition in the 5-50 Torr pressure regime using a wide range of precursors, including ruthenium β-diketonates, little or no film was deposited using $Ru(thd)_3$ under the higher pressure conditions.

TABLE 1

Process conditions comparison for the deposition of $Ru(EtCp)_2$ precursors relative to $Ru(thd)_3$ precursors.

| p/Torr | T/° C. | co-reactant $H_2$ | co-reactant $O_2$ | $Ru(EtCp)_2$ Å (XRF) | $Ru(EtCp)_2$ µΩ-cm | $Ru(thd)_3$ Å (XRF) | $Ru(thd)_3$ µΩ-cm |
|---|---|---|---|---|---|---|---|
| 0.8 | 225 | 4% | 2% | 3 | | 0 | |
| 0.8 | 300 | 4% | 0% | 5 | | 0 | |
| 0.8 | 300 | 0% | 80% | 42 | 1400 | 32 | 212 |
| 0.8 | 400 | 4% | 2% | 27 | | 26 | |
| 2.5 | 225 | 4% | 0% | 0 | | 0 | |
| 2.5 | 225 | 0% | 80% | 2 | | 0 | |
| 2.5 | 300 | 4% | 2% | 1 | | 2 | |
| 2.5 | 400 | 4% | 0% | 1 | | 0 | |
| 2.5 | 400 | 0% | 80% | 97 | 25,000 | 5 | |
| 8.0 | 225 | 4% | 2% | 3 | | 0 | |
| 8.0 | 300 | 4% | 0% | 4 | | 0 | |
| 8.0 | 300 | 0% | 80% | 87 | 490 | 2 | |
| 8.0 | 400 | 4% | 2% | 86 | | 4 | |

Further experiments were performed for each precursor using the most promising process conditions from the first set of experiments reported in Table 1. For $Ru(EtCp)_2$, a range from 2-80% $O_2$ and from 260-345° C. was further examined at 8.0 Torr. It was determined that the lowest resistivity film (350 µΩ-cm in a film that was 91 Å by XRF and 317 Å by ellipsometry) was deposited at 80% $O_2$ and 345° C. For $Ru(thd)_3$, a range from 0.4-1.6 Torr and 260-345° C. was further examined at 90% $O_2$. It was determined that the lowest resistivity film (138 µΩ-cm in a film that was 23 Å by XRF and 59 Å by ellipsometry) was deposited at 1.0 Torr and 300° C. The lower resistivity in thinner films deposited using the $Ru(thd)_3$ precursor indicates that $Ru(thd)_3$ is a superior precursor for very thin film deposition.

EXAMPLE 2

Process Conditions for the Deposition of the Nucleation Layer

The first deposition step of the CVD method taught herein results in the deposition of a ruthenium nucleation layer. Table 2 illustrates four different ruthenium nucleation layers deposited according to the method taught herein and the conditions and characteristics of each layer:

TABLE 2

Process conditions for deposition of ruthenium nucleation layer

| Process number | T/° C. | p/Torr | Reactant gases (wt %) | Deposition rate | Density | Phase | resistivity/ $\mu\Omega$-cm |
|---|---|---|---|---|---|---|---|
| 1 | 400 | 0.8 | 2% $O_2$/ 4% $H_2$ | 2.7 Å/min | 41% | metal | ∞ |
| 2 | 300 | 0.8 | 90% $O_2$ | 3.0 Å/min | 29% | oxide | 214 |
| 3 | 300 | 1.0 | 90% $O_2$ | 3.0 Å/min | 50% | metal | 138 |
| 4 | 300 | 0.8 | 2% $O_2$/ 4% $H_2$ | 2.5 Å/min | 29% | metal | ∞ |

In all cases, the ruthenium source gas was a vaporized solution of Ru(thd)$_3$. It was initially thought that process numbers 1 and 4, using co-reactant gases having lower oxygen content, would result in a deposited ruthenium nucleation layer with less residual oxygen thereby providing a more conductive layer. However, the resistivity was too high to measure, indicating that the films were not continuous. Without being bound by theory, the ruthenium nucleation layers deposited in process numbers 1 and 4 may have been "island-like" with nuclei that failed to coalesce because the ruthenium layer deposited was too thin. Process numbers 2 and 3 both produced continuous films.

EXAMPLE 3

Process Conditions for Depositing the Upper Layer

The second deposition step of the CVD method results in the deposition of a ruthenium upper layer yielding the final ruthenium thin film, as taught herein in one aspect of the invention. Table 3 illustrates three different experiments and the results of each, wherein the ruthenium nucleation layer and upper layer were deposited according to the first and second set of process conditions, respectively:

TABLE 3

Process conditions for deposition of ruthenium thin films

| Process number | $T_1$/° C. $T_2$/° C. | $p_1$/Torr $p_2$/Torr | gas$_1$ (wt %) gas$_2$ (wt %) | prec. rate$_1$ prec. rate$_2$ | Density | resistivity/ $\mu\Omega$-cm | Adhesion tape |
|---|---|---|---|---|---|---|---|
| 5 | 300 300 | 1.0 0.4 | 90% $O_2$ 30% $O_2$ | 15 µmol/min 15 µmol/min | 44% | 172 | fail |
| 6 | 300 400 | 0.8 0.4 | 90% $O_2$ 2% $O_2$/4% $H_2$ | 15 µmol/min 15 µmol/min | 80% | 14.5 | pass |
| 7 | 300 400 | 0.8 0.4 | 90% $O_2$ 2% $O_2$/4% $H_2$ | 15 µmol/min 7.5 µmol/min | 78% | 11.2 | pass |

Process 5 represented a ruthenium thin film having a nucleation layer grown according to conditions enumerated in process number 3 hereinabove. Although the resistivity of the ruthenium thin film deposited during the two-step CVD process was measurable, indicating a continuous film, the ruthenium thin film had poor adhesion to the underlying substrate as indicated by the tape adhesion test. In other words, the film deposited according to the Process 5 conditions is not a peel-resistant layer film.

Processes 6 and 7 represented a ruthenium thin film having a nucleation layer grown according to the conditions enumerated in process number 2 hereinabove. The ruthenium thin film deposited during the two-step CVD process in processes 6 and 7 displayed low resistivities and superior adhesion to the underlying substrate, i.e., peel-resistant layer films were deposited. Resistivity of the ruthenium thin film was improved by adjusting the rate of ruthenium precursor delivery during step two of the process, e.g., process number 7.

FIG. 1 represents a schematic of the process conditions associated with deposition process 7 as a function of time (arbitrary units), where the sharp change in process conditions represents the change from step one process conditions, i.e., nucleation layer deposition, to the step two process conditions, i.e., upper layer deposition.

Figure 2:
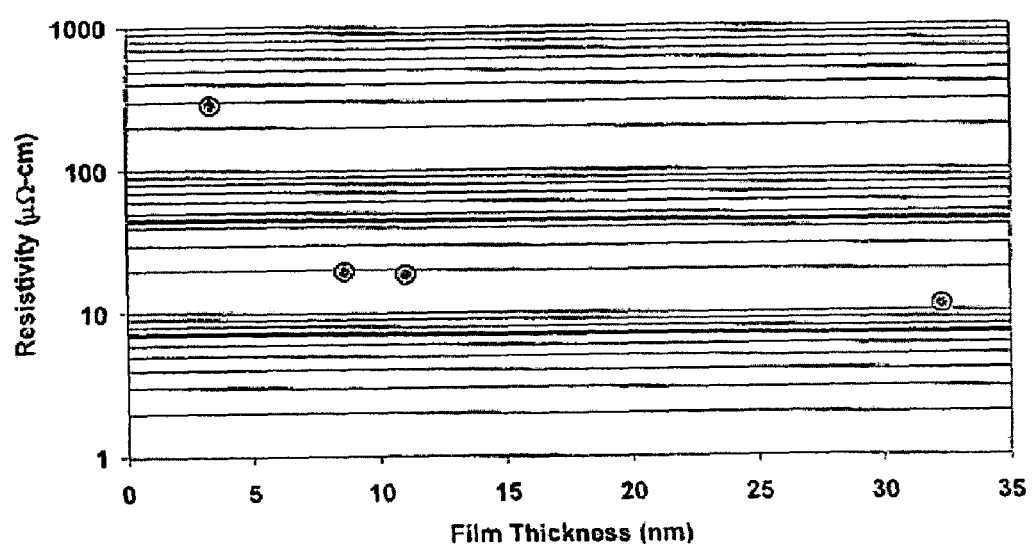
FIG. 2 illustrates the resistivity of films as a function of film thickness for ruthenium thin films deposited according to CVD process 7 described herein.

FIG. 2 illustrates the resistivity of ruthenium thin films as a function of film thickness for ruthenium thin films deposited according to the conditions enumerated in process 7 hereinabove.

EXAMPLE 4

Process Conditions for Surface Reaction Rate-limited Deposition

In order to deposit conformal films over high aspect ratio structures, surface reaction rate-limited depositions are preferred. To determine the precursor flow rates necessary to maintain surface reaction rate-limited deposition, experiments at two temperatures, 280° C. and 300° C., were performed. Table 4 summarizes the film thicknesses that were deposited at the various temperatures, precursor rates and deposition times.

TABLE 4

Film thicknesses and resistivities relative to precursor flow rates

| Process number | T/° C. | p/Torr | co-reactant (%) | Precursor rate | Time/sec | Thickness/ Ellips.Å | resistivity/ μΩ-cm |
|---|---|---|---|---|---|---|---|
| 8 | 280 | 1.0 | 90% $O_2$ | 15 μmol/min | 300 | 49 | 234 |
| 9 | 280 | 1.0 | 90% $O_2$ | 30 μmol/min | 300 | 51 | 238 |
| 10 | 300 | 1.0 | 90% $O_2$ | 15 μmol/min | 300 | 94 | 203 |
| 11 | 300 | 1.0 | 90% $O_2$ | 30 μmol/min | 300 | 125 | 180 |
| 12 | 300 | 1.0 | 90% $O_2$ | 30 μmol/min | 90 | 27 | 1300 |
| 13 | 300 | 1.0 | 90% $O_2$ | 60 μmol/min | 90 | 28 | 1050 |

Comparing process 8 to process 9, it can be seen that at 280° C., film thickness is independent of precursor rate over the range from 15-30 μmol/min. In contrast, comparing process 10 to process 11, both at 300° C., the film thickness increases significantly as precursor rate increases from 15 μmol/min to 30 μmol/min. Comparing process 12 to process 13, both at 300° C., the film thickness is independent of precursor rate over the range from 30-60 μmol/min. It was determined that the precursor rate of 15 μmol/min was sufficient to maintain surface reaction rate-limited deposition at 280° C., and 30 μmol/min was sufficient to maintain surface reaction rate-limited deposition at 300° C.

EXAMPLE 5

Pulsed Process for Upper Layer of Ruthenium Film

Figure 3:
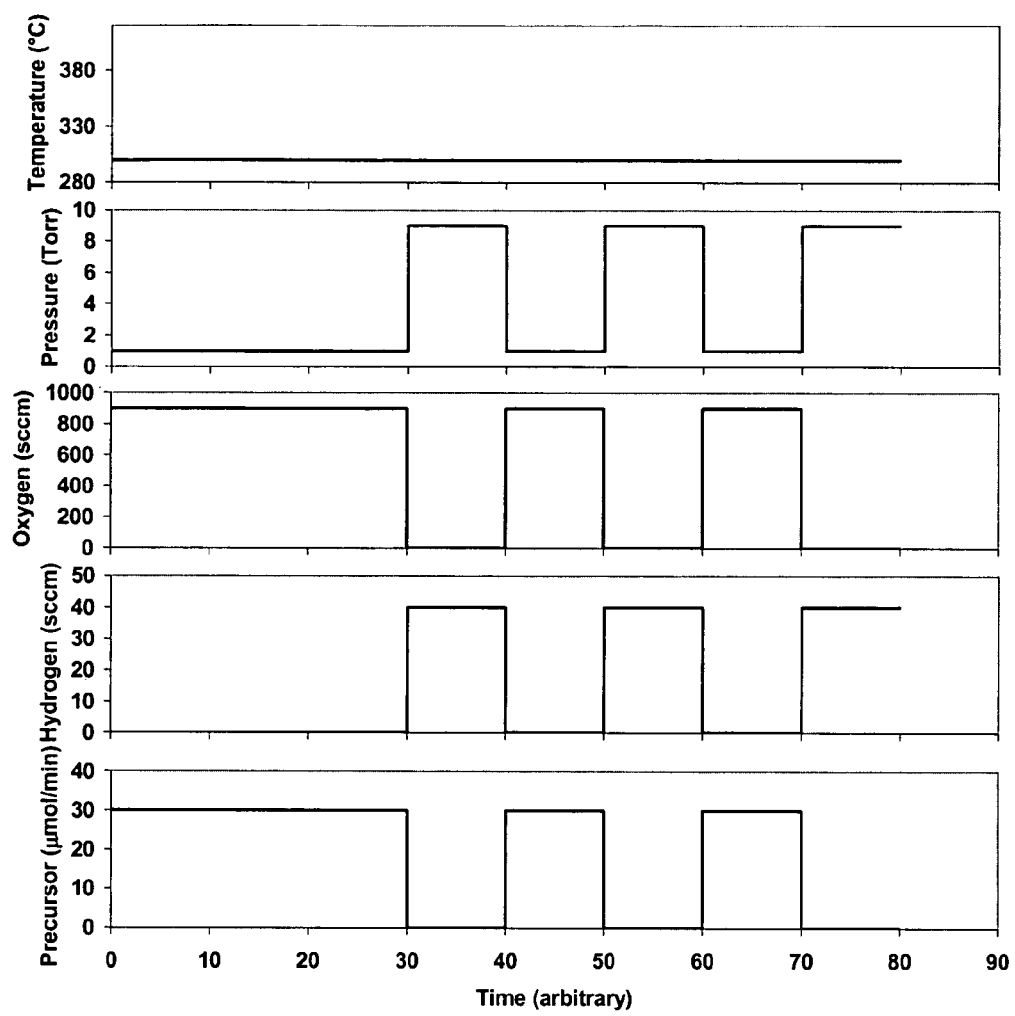
FIG. 3 is a schematic of process variables as a function of time (arbitrary units) for the pulsed process described in Example 5.
Figure 4:
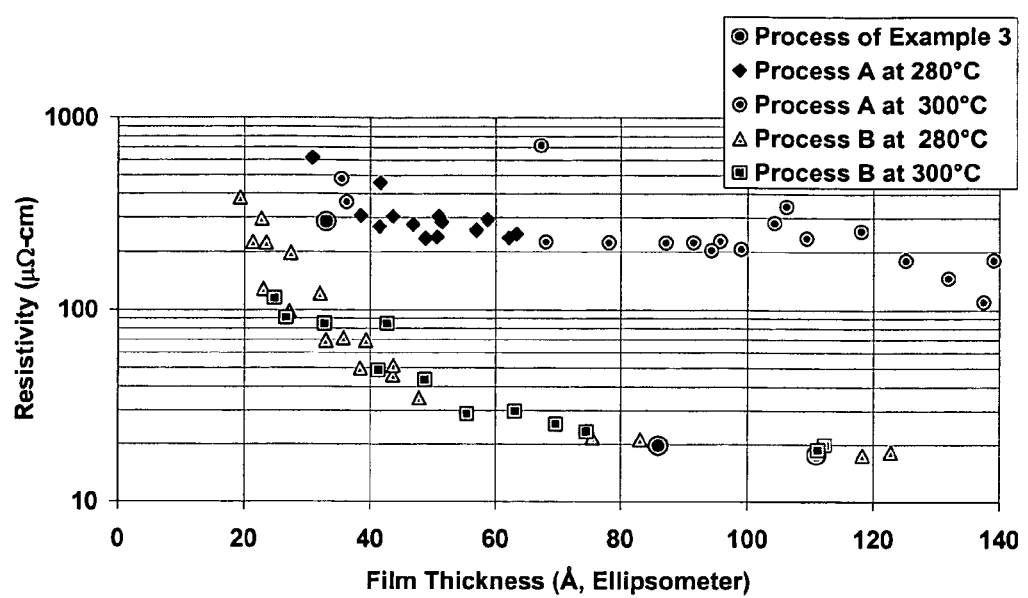
FIG. 4 is a plot of the resistivity of the films as a function of film thickness. (♦) continuous first deposition step at 280° C., (●) continuous first deposition step at 300° C., (●) ruthenium thin film deposited in Example 3, (▲) pulsed process of Example 5 at 280° C., (■) pulsed process of Example 5 at 300° C.

Based on the process conditions determined in Examples 1 through 4, two pulsed processes were performed, one at 280° C. and the other at 300° C. The schematic of process variables as a function of time (arbitrary units) is shown in FIG. 3. In each case, the length of the first deposition step was determined by taking the shortest time at which resistivity could be measured, however, other methods of determining full coverage could also be used. Following nucleation layer deposition at 1 Torr and 90% $O_2$, the deoxygenating step (devoid of precursor) was carried out at 9 Torr and 4% $H_2$. Temperature remained constant throughout the deposition of the nucleation layer and the subsequent deoxygenating of the ruthenium layer. Film thickness was varied by changing the number of subsequent deposition cycles. FIG. 4 illustrates the resistivity of the films deposited by pulsing as a function of film thickness, labeled process B ((▲) pulsed process at 280° C., (■) pulsed process at 300° C.), relative to films deposited at continuous first deposition step conditions, labeled process A ((♦) continuous first deposition step at 280° C., (●) continuous first deposition step at 300° C.). Continuous first deposition step conditions (process A) include a pressure of 1 Torr and 90% $O_2$, which result in a surface reaction rate-limited deposition. The resulting films are conformal, but a higher percentage of impurities are incorporated into the films of continuous process A compared to pulsed process B.

Accordingly, while the invention has been described herein in reference to specific aspects, features and illustrative embodiments of the invention, it will be appreciated that the utility of the invention is not thus limited, but rather extends to and encompasses numerous other aspects, features and embodiments. Accordingly, the claims hereafter set forth are intended to be correspondingly broadly construed, as including all such aspects, features and embodiments, within their spirit and scope.

What is claimed is:

1. A method for depositing a ruthenium thin film onto a substrate, said method comprising:
    (a) depositing a nucleation layer comprising ruthenium metal onto the substrate by chemical vapor deposition, wherein the nucleation layer is deposited using a first ruthenium precursor/co-reactant gas mixture having greater than about 30 mole percent of the co-reactant gas, under nucleation layer CVD conditions including a temperature of from about 250° C. to about 340° C. and a ruthenium precursor gas flow rate that is sufficient to maintain a surface reaction rate-limited deposition; and
    (b) depositing an upper layer comprising ruthenium metal onto the nucleation layer by chemical vapor deposition, wherein the upper layer is deposited using a second ruthenium precursor/co-reactant gas mixture having less than 50 mole percent of the co-reactant gas under upper layer CVD conditions, including a ruthenium precursor gas flow rate that is less than that needed to maintain a surface reaction rate-limited deposition.

2. The method of claim 1, wherein the upper layer CVD conditions are more reducing than the nucleation layer CVD conditions.

3. The method of claim 1, wherein the ruthenium precursor gas flow rate for the nucleation layer is in a range of from about 2 μmol/min to about 100 μmol/min.

4. The method of claim 1, wherein the nucleation layer CVD conditions comprise pressure in a range of about 0.1 Torr and about 8 Tore.

5. The method of claim 1, wherein the nucleation layer CVD conditions comprise pressure in a range of about 0.4 Torr to about 1.6 Torr.

6. The method of claim 1, wherein at least one of the first and second ruthenium precursor/co-reactant gas mixtures further comprises an inert gas.

7. The method of claim 1, wherein the first and second ruthenium precursors are the same.

8. The method of claim 1, wherein the first and second ruthenium precursors are different.

9. The method of claim 1, wherein from about 80 mole % to about 95 mole % of the first ruthenium precursor/co-reactant gas mixture is a co-reactant gas.

10. The method of claim 9, wherein the first co-reactant gas comprises oxygen.

11. The method of claim 1, wherein the first and the second ruthenium precursors are independently selected from the group consisting of ruthenocenes, ruthenium β-diketonares, fluorinated ruthenium β-diketonates, ruthenium carbonyls, ruthenium oxides and ruthenium halides.

12. The method according to claim 11, wherein the ruthenocenes have the formula (Cp')Ru(Cp"), where Cp' and Cp" can be same or different and have the general formula:

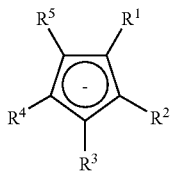

where $R^1$-$R^5$ are independently selected from the group consisting of H, F, and straight-chained or branched $C_1$-$C_5$ alkyl groups.

13. The method of claim 11, wherein the ruthenocene comprises $Ru(EtCp)_2$ or $Ru(Cp)_2$.

14. The method according to claim 11, wherein the ruthenium β-diketonates have the formula $Ru(\beta\text{-diketonate})_3$, where β-diketonate has the general formula:

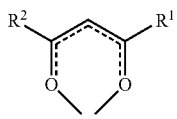

where $R^1$ and $R^2$ are independently selected from the group consisting of H, F, straight-chained or branched $C_1$-$C_5$ alkyl groups, and fluorine-substituted straight-chained or branched $C_1$-$C_5$ alkyl groups.

15. The method of claim 11, wherein the ruthenium β-diketonate comprises a compound selected from the group consisting of: tris(2,4-pentanedionate) ruthenium ($Ru(acac)_3$); tris(1,1,1-trifluoro-2,4-pentanedionate) ruthenium ($Ru(tfac)_3$); tris(2,2,6,6-tetramethyl-3,5-heptanedionate) ruthenium ($Ru(thd)_3$); tris(1,1,1,5,5,5-hexafluoro-2,4-pentanedionate) ruthenium ($Ru(hfac)_3$); tris(2,2,7-tetramethyl-3,5-octanedionato) ruthenium ($Ru(tod)_3$); tris(6,6,7,7,8,8,8-heptafluoro-2,2-dimethyl-3,5-octanedionato) ruthenium ($Ru(fod)_3$); and tris(2,4-octanedionato) ruthenium ($Ru(od)_3$).

16. The method of claim 11, wherein the ruthenium β-diketonate comprises $Ru(thd)_3$ or $Ru(hfac)_3$.

17. The method of claim 1, wherein the rate of introduction of the first ruthenium precursor is in a range of about 15 μmol/min to about 30 μmol/min.

18. The method of claim 1, wherein the substrate comprises a substrate material selected from the group consisting of silicon, silicon dioxide, silicon nitride, hafnium silicon oxide, hafnium silicon oxynitride, Co(WP), copper, titanium nitride, titanium aluminum nitride, tantalum nitride, tantalum pentaoxide, barium strontium titanate and lead zirconate titanate.

19. The method of claim 1, wherein the resistivity of the nucleation layer is less than about 250 μΩ-cm.

20. The method of claim 1, wherein the rate of deposition of the nucleation layer is in a range of about 5 Å/min to about 1 Å/min.

21. The method of claim 1, wherein the upper layer consists essentially of ruthenium metal.

22. The method of claim 1, wherein the upper layer CVD conditions comprise temperature in a range of about 280° C. and about 400° C.

23. The method of claim 1, wherein the upper layer CVD conditions comprise pressure in a range of about 0.1 Torr and about 2 Torr.

24. The method of claim 1, wherein the upper layer CVD conditions comprise pressure in a range of about 0.2 Torr to about 1.0 Torr.

25. The method of claim 1, wherein both the first and the second ruthenium precursor/co-reactant gas mixtures further comprise an inert gas.

26. The method of claim 1, wherein from about 1 mole % to about 10 mole % of the second ruthenium precursor/co-reactant gas mixture is the co-reactant gas.

27. The method according to claim 26, wherein the second co-reactant gas comprises oxygen.

28. The method according to claim 26, wherein the second co-reactant gas comprises an oxygen:hydrogen gas mixture.

29. The method of claim 28, wherein the oxygen:hydrogen gas mixture has a mole ratio in a range of about 1:1 to about 1:3.

30. The method of claim 11, wherein the first and the second ruthenium precursors are the same.

31. The method according to claim 11, wherein the first and the second ruthenium precursors are different.

32. The method of claim 31, wherein the first ruthenium precursor is selected from the group consisting of ruthenium β-diketonates, fluorinated ruthenium β-diketonates, ruthenium carbonyls, and ruthenium oxides and second ruthenium precursor is selected from the group consisting of ruthenocenes, ruthenium β-diketonates, fluorinated ruthenium β-diketonates, ruthenium carbonyls, ruthenium oxides and ruthenium halides.

33. The method of claim 31, wherein the first ruthenium precursor is a ruthenium β-diketonate and the second ruthenium precursor is a ruthenocene.

34. The method of claim 1, wherein the rate of introduction of the second ruthenium precursor is in a range of about 5 μmol/min to about 20 μmol/min.

35. The method of claim 1, wherein the resistivity of the ruthenium thin film is in a range of about 8 μΩ-cm to about 25 μΩ-cm, and has a thickness in a range of from about 10.0 nm to about 35.0 nm thick.

36. The method of claim 1, wherein the resistivity of the ruthenium thin film is in a range of about 12 μΩ-cm to about 25 μΩ-cm, and has a thickness in a range of from about 5.0 nm to about 15.0 nm thick.

37. The method of claim 1, wherein the resistivity of the ruthenium thin film is in a range of about 20 μΩ-cm to about 125 μΩ-cm, and has a thickness in a range of from about 2.0 nm to about 5.0 nm thick.

38. The method of claim 1, wherein the resistivity of the ruthenium thin film is in a range of about 10 μΩ-cm to about 100 μΩ-cm.

39. The method of claim 1, wherein the thickness of the ruthenium thin film is in a range of about 25 Å to about 350 Å.

40. The method of claim 1, wherein the rate of deposition of the upper layer is in a range of about 5 Å/min to about 1 Å/min.

41. The method of claim 1, wherein the source of either or both ruthenium precursors in the respective gas mixture is a solid and is delivered to the chemical vapor deposition chamber by a solid delivery approach.

42. The method of claim 41, further comprising the separate addition of a solvent to the solid delivery approach.

43. The method of claim 1, wherein the source of either or both ruthenium precursors in the respective gas mixture is a liquid or a solution and is delivered by a liquid delivery approach.

44. The method of claim 1, further comprising the step of annealing the nucleation layer prior to deposition of the upper layer.

45. The method of claim 1, wherein from about 80 mole % to about 90 mole % of the first ruthenium precursor/co-reactant gas mixture is oxygen.

46. The method of claim 1, wherein from about 80 mole % to about 95 mole % of the first ruthenium precursor/co-reactant gas mixture is oxygen and from about 1 mole % to about 20 mole % of the second ruthenium precursor/co-reactant gas mixture is oxygen.

47. The method of claim 1, wherein the ruthenium thin film has an impurity content of less than about 2 atomic %.

48. The method of claim 1, wherein the substrate comprises a metallic portion and a dielectric portion.

49. The method of claim 48, wherein the nucleation layer on the metallic and dielectric portions of the substrate is a peel-resistant layer film.

50. The method of claim 46 wherein the second co-reactant gas is a mixture of oxygen and hydrogen.

51. The method of claim 1, wherein each co-reactant gas is individually selected from the group consisting of oxygen, hydrogen, steam, nitrous oxide, ozone, carbon monoxide, carbon dioxide, and mixtures of oxygen and hydrogen.

52. A method for depositing a ruthenium thin film onto a substrate, said method comprising:
(a) depositing a nucleation layer comprising ruthenium onto the substrate by chemical vapor deposition, wherein the nucleation layer is deposited from a nucleation layer ruthenium precursor/co-reactant gas mixture, the mixture having at least a 30 mole % oxygen content, in an oxidizing environment under nucleation layer CVD conditions;
(b) deoxygenating the so formed nucleation layer in a reducing environment, in the absence of the ruthenium precursor/co-reactant gas mixture; and
(c) sequentially repeating steps (a) and (b) until the ruthenium thin film of desired thickness is deposited onto the substrate.

53. The method of claim 52, wherein said deoxygenating comprises exposing said nucleation layer to a gas mixture comprising a reducing agent and optionally, an inert gas.

54. The method of claim 53, wherein the reducing agent comprises hydrogen.

55. The method of claim 52, wherein the deoxygenating step is conducted under conditions comprising pressure in a range of about 0.1 Torr to about 100 Torr and temperature in a range of about 250° C. to about 350° C.

56. The method of claim 52, wherein the co-reactant gas is oxygen.

57. The method of claim 52, wherein the temporal length of the deposition of the initial nucleation layer is greater than that of the succeeding deposition steps.

58. The method of claim 52, wherein the deposited nucleation layer comprises ruthenium oxide.

59. The method of claim 52, wherein the nucleation layer CVD conditions comprise temperature in a range of about 250° C. and about 340° C.

60. The method of claim 52, wherein the nucleation layer CVD conditions comprise pressure in a range of about 0.1 Torr and about 8 Torr.

61. The method of claim 52, wherein the ruthenium precursor/co-reactant gas mixture further comprises an inert gas.

62. The method of claim 52, wherein the deoxygenation is accomplished by annealing.

63. The method of claim 52, wherein the flow rate of the ruthenium precursor is sufficient to maintain surface reaction rate-limited deposition.

64. The method of claim 52, wherein the CVD conditions include a pressure of from about 0.1 Torr to about 5.0 Torr, a temperature of from about 250° C. and about 340° C., and a flow rate of the ruthenium precursor of fmm about 15 μmol/min to about 30 μmol/min and the co-reactant gas is oxygen and is present in a concentration of from about 80 mole % to about 95 mole %.

65. The method of claim 64, wherein the co-reactant gas is present in a concentration of from about 80 mole % to about 90 mole %.

66. The method of claim 52, wherein the co-reactant gas comprises from about 80 mole % to about 95 mole % of the ruthenium precursor/co-reactant gas mixture.

67. The method of claim 66, wherein the co-reactant gas comprises Oxygen.

68. The method of claim 52, wherein the ruthenium precursor comprises a ruthenium compound selected from the group consisting of ruthenocenes, ruthenium β-diketonates, fluorinated ruthenium β-diketonates, ruthenium carbonyls, ruthenium oxides and ruthenium halides.

69. The method according to claim 68, wherein the ruthenocenes have the formula (Cp')Ru(Cp''), where Cp' and Cp'' can be same or different and have the general formula:

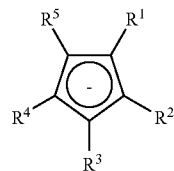

where $R^1$-$R^5$ are independently selected from the group consisting of H, F, and straight-chained or branched $C_1$-$C_5$ alkyl groups.

70. The method according to claim 68, wherein the ruthenocene comprises $Ru(EtCp)_2$ or $Ru(Cp)_2$.

71. The method according to claim 68, wherein the ruthenium β-diketonates have the formula Ru(β-diketonate)$_3$, where β-diketonate has the general formula:

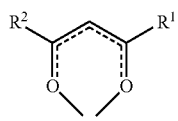

where $R^1$ and $R^2$ are independently selected from the group consisting of H, F, straight-chained or branched $C_1$-$C_5$ alkyl groups, and fluorine-substituted straight-chained or branched $C_1$-$C_5$ alkyl groups.

72. The method of claim 68, wherein the ruthenium β-diketonate comprises a compound selected from the group consisting of: tris(2,4-pentanedionate) ruthenium (Ru(acac)$_3$); tris(1,1,1-trifluoro-2,4-pentanedionate) ruthenium (Ru(tfac)$_3$); tris(2,2,6,6-tetramethyl-3,5-heptanedionate) ruthenium (Ru(thd)$_3$); tris(1,1,1,5,5,5-hexafluoro-2,4-pentanedionate) ruthenium (Ru(hfac)$_3$); tris(2,2,7-tetramethyl-3,5-octanedionato) ruthenium (Ru(tod)$_3$); tris(6, 6,7,7,8,8,8-heptafluoro-2,2-dimethly 1-3,5-octanedionato) ruthenium (Ru(fod)$_3$); and tris(2,4-octanedionato) ruthenium (Ru(od)$_3$).

73. The method of claim 68, wherein the ruthenium β-diketonate comprises Ru(thd)$_3$ or Ru(hfac)$_3$.

74. The method of claim 52, wherein the rate of introduction of the ruthenium precursor is in a range of about 15 μmol/min to about 30 μmol/min.

75. The method of claim 52, wherein the substrate comprises a substrate material selected from the group consisting of silicon, silicon dioxide, silicon nitride, hafnium silicon oxide, hafnium silicon oxynitride, Co(WP), copper, titanium nitride, titanium aluminum nitride, tantalum nitride, tantalum pentaoxide, barium strontium titanate and lead zirconate titanate.

76. The method of claim 52, wherein the resistivity of the nucleation layer is less than about 250 μΩ-cm.

77. The method of claim 52, wherein the rate of deposition of the nucleation layer is in a range of about 5 Å/min to about 1 Å/min.

78. The method of claim 52, wherein the resistivity of the ruthenium thin film is in a range of about 15 μΩ-cm to about 50 μΩ-cm, and has a thickness in a range of from about 3.0 nm to about 10.0 nm.

79. The method of claim 52, wherein the resistivity of the ruthenium thin film is in a range of about 15 μΩ-cm to about 30 μΩ-cm, and has a thickness in a range of from about 4.0 nm to about 8.0 nm.

* * * * *

UNITED STATES PATENT AND TRADEMARK OFFICE
CERTIFICATE OF CORRECTION

PATENT NO.         : 7,285,308 B2                                                       Page 1 of 1
APPLICATION NO. : 10/803750
DATED               : October 23, 2007
INVENTOR(S)       : Bryan C. Hendrix et al.

It is certified that error appears in the above-identified patent and that said Letters Patent is hereby corrected as shown below:

Column 14, line 44 (claim 4): "8 Tore" should be -- 8 Torr --.

Column 14, line 63 (claim 11): "β-diketonares" should be -- β-diketonates --.

Column 18, line 19 (claim 67): "Oxygen" should be -- oxygen --.

Column 19, line 1 (claim 72): "6,7,7,8,8,8-heptafluoro-2,2-dimethly l-3,5-octadionato)" should be -- 6,7,7,8,8,8-heptafluoro-2,2-dimethyl-3,5-octadionato --.

Signed and Sealed this

Eighteenth Day of March, 2008

JON W. DUDAS
*Director of the United States Patent and Trademark Office*